United States Patent [19]
Rennie et al.

[11] Patent Number: 5,889,295
[45] Date of Patent: Mar. 30, 1999

[54] SEMICONDUCTOR DEVICE

[75] Inventors: John Rennie, Tokyo; Genichi Hatakoshi, Yokohama, both of Japan

[73] Assignee: Kabushiki Kaisha Toshiba, Kawasaki, Japan

[21] Appl. No.: 806,638

[22] Filed: Feb. 26, 1997

[30] Foreign Application Priority Data

Feb. 26, 1996 [JP] Japan ................................. 8-038260

[51] Int. Cl.$^6$ ................................................ H01L 33/00
[52] U.S. Cl. ............................ 257/96; 257/99; 257/102; 257/103; 257/15; 257/22
[58] Field of Search ............................. 257/15, 22, 96, 257/99, 102, 103; 372/45, 46

[56] References Cited

U.S. PATENT DOCUMENTS

| 5,617,446 | 4/1997 | Ishibashi et al. | 257/99 |
| 5,670,798 | 9/1997 | Schetzina | 257/101 |

FOREIGN PATENT DOCUMENTS

| 57-10280 | 1/1982 | Japan . |
| 4-213878 | 8/1992 | Japan . |
| 7-202265 | 8/1995 | Japan . |

OTHER PUBLICATIONS

Publication: Applied Physics Letters: vol.66 No. 22 pp. 2688–2690, T. Detchprohm et al "Hydride Vapor Phase Epitaxial Growth Of A High Quality GaN Film Using A ZnO Buffer Layer", Nov. 1992.

*Primary Examiner*—Minh Loan Tran
*Attorney, Agent, or Firm*—Pillsbury Madison & Sutro LLP

[57] ABSTRACT

Disclosed is a long-life GaN-based semiconductor device which is achieved by reducing the operating voltage of the semiconductor device comprising a GaN-based or a ZnSe-based compound semiconductor formed on a sapphire substrate and by preventing the electromigration of metal atoms from an electrode into compound semiconductor layers. The operating voltage of the GaN-based or ZnSe-based semiconductor device formed on a sapphire substrate or a SiC substrate can be greatly reduced by employing a ZnO layer doped with a significant amount of Al as a material for forming ohmic contact to p- or n- compound semiconductor layers. The long-life GaN-based semiconductor device can be attained by preventing electromigration of atoms from a metallic electrode by use of ZnO layer. If a superlattice including the ZnO layer is employed as an optical guide layer or if the superlattice including the ZnO layer as an active layer, a long-life laser diode with a low operating voltage and a wide wavelength range can be obtained.

21 Claims, 13 Drawing Sheets

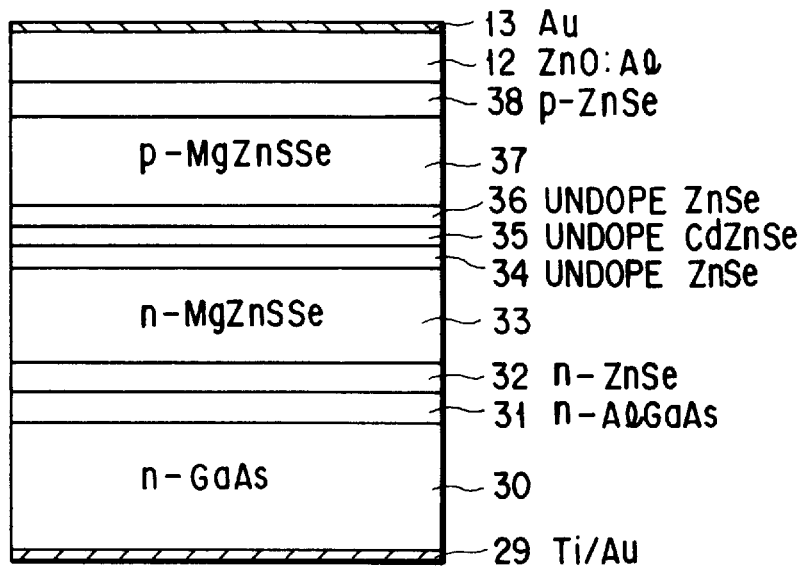
F I G. 14
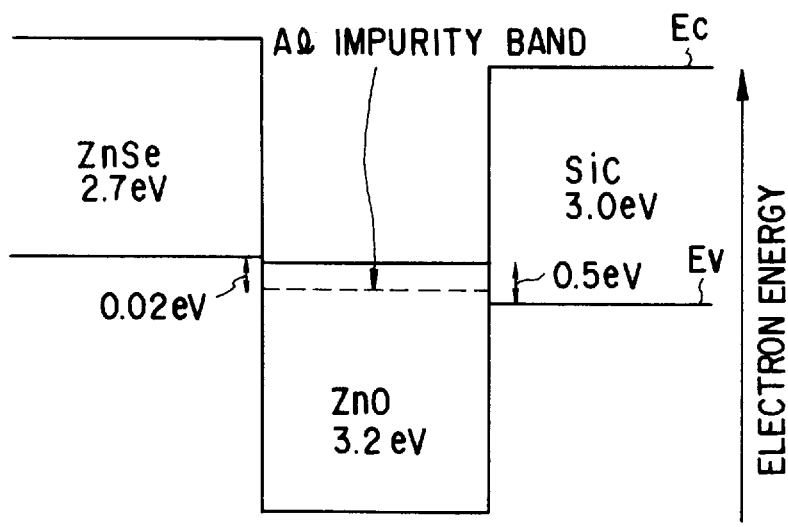
F I G. 15

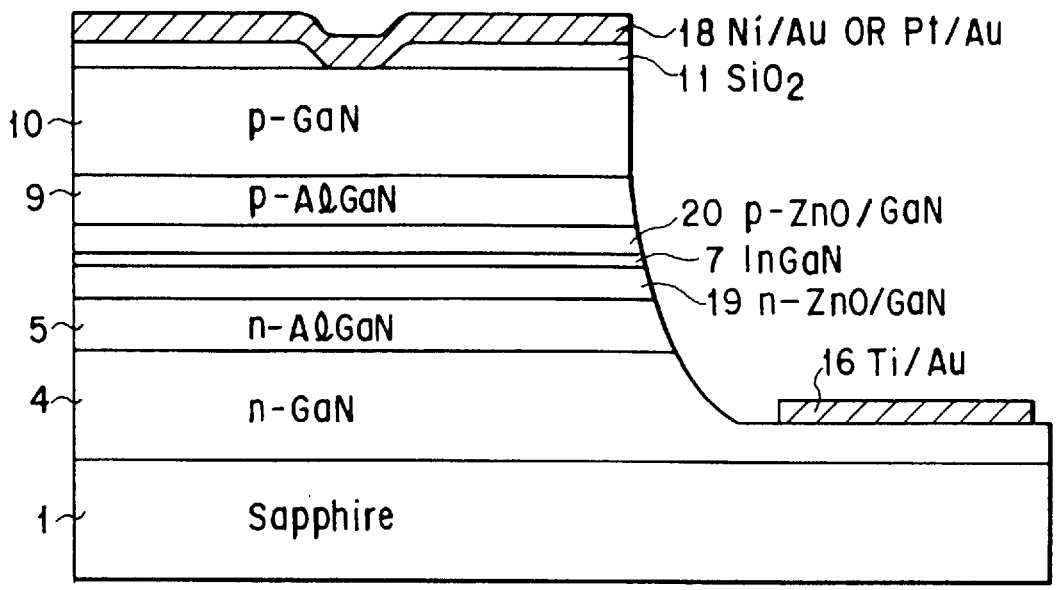
F I G. 20
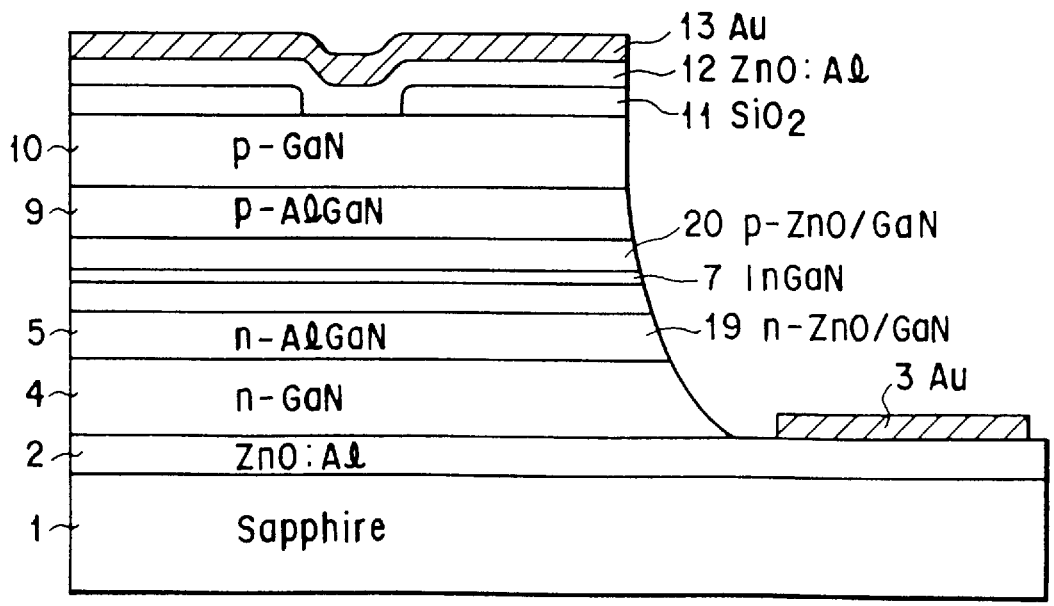
F I G. 21

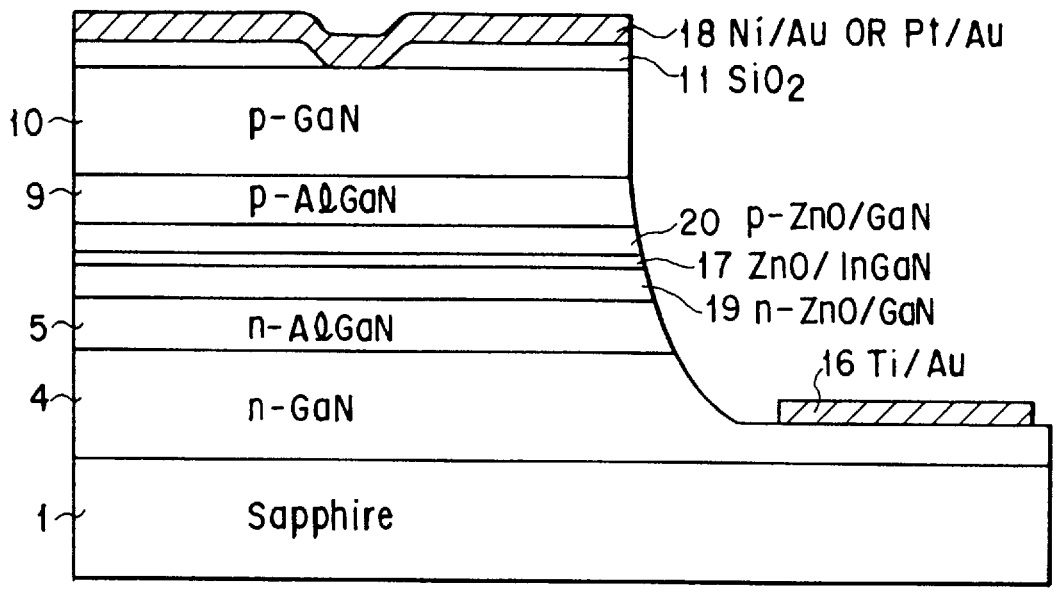
F I G. 22
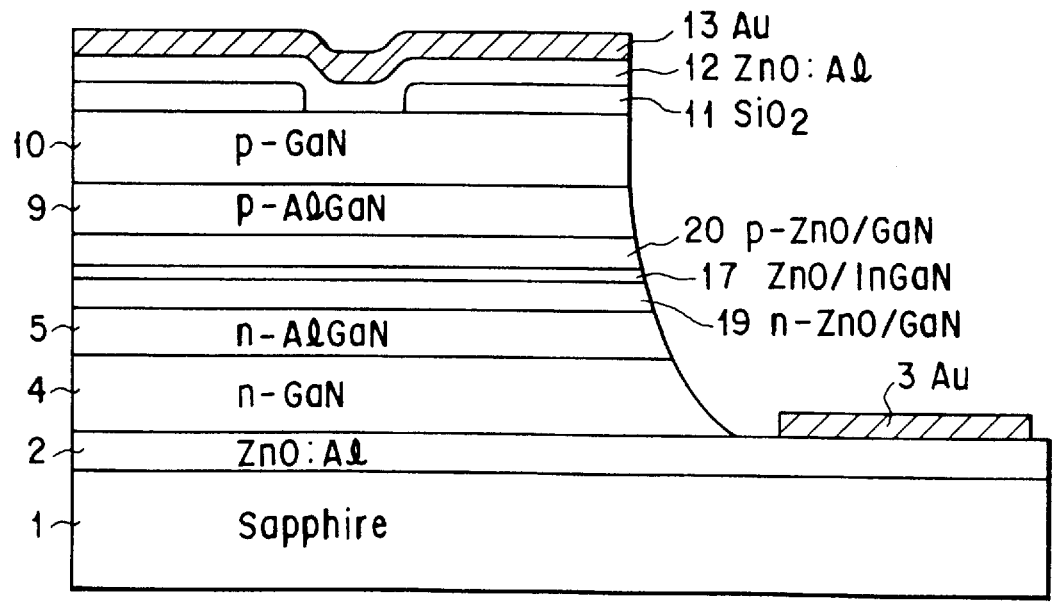
F I G. 23

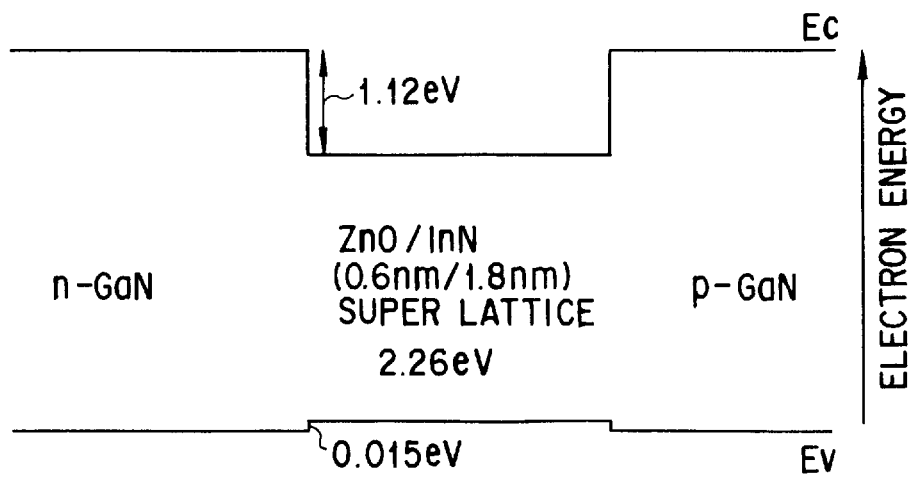
F I G. 25

SEMICONDUCTOR DEVICE

BACKGROUND OF THE INVENTION

The present invention relates to a semiconductor device comprising an insulating or conducting substrate and a GaN-based compound semiconductor layer or a ZnSe-based II—VI compound semiconductor layer formed on the substrate. More specifically, the present invention relates to a semiconductor device whose operating voltage is much reduced by providing a material playing a part in reducing the resistance, between a compound semiconductor layer and a growth substrate, between the compound semiconductor layer and a metal electrode, between the growth substrate and the metal electrode, or between individual compound semiconductor layers. The present invention further relates to a method of producing the semiconductor device.

The GaN-based compound semiconductor device hitherto-most widely employed has an electrode structure called "side injection structure". The side injection structure is formed by growing the GaN-based compound layer on a single crystalline insulating substrate such as sapphire, subjecting the resultant structure to mesa formation, providing a first electrode for current supply on a top of the mesa, and extending a second electrode for current supply from the lower part of the mesa along the upper surface of the insulating substrate. Such a structure is also employed in a semiconductor device comprising a ZnSe-based compound.

Compared to a semiconductor device having a first electrode on the top of the semiconductor layers grown on a conductive substrate and a second electrode on the lower side of the conductive substrate, the semiconductor device having the side injection electrode structure has a drawback in that it tends to have a high resistance ascribed to its structure.

Hereinafter, a laser diode will be referred to as LD, light emitting diode as LED, the first electrode as upper electrode, and the second electrode as lower electrode. Suffixes representing the compositions of mixed crystal compound semiconductors will be omitted unless otherwise needed.

If the contact region of electrodes of the semiconductor substrate exhibits a high resistance, the operating voltage of the semiconductor device will increase. Consequently, the device will fail to operate continuously for a long time. Furthermore, the high resistance influences the current distribution density within the device, providing an adverse effect on the operation performance of the device.

FIG. 1 is a cross-sectional view schematically showing the current density distribution within a conventional GaN-based LD grown on a sapphire substrate. Curved lines drawn on the cross-section of the multiple-layer structure indicate the profile of the current density distribution. A GaN-based LD or a GaN-based LED emitting blue to violet has an active layer 7 made of InGaN. On the upper and low sides of the active layer 7, a lower optical guide layer 6 made of n-type GaN (n-GaN) and an upper optical guide layer 8 made of p-type GaN (p-GaN) are respectively provided. Adjacent to the optical guide layers 6 and 8, a cladding layer 5 made of n-AlGaN and a cladding layer 9 made of p-AlGaN for optical confinement are respectively formed.

On the upper and the lower sides of this double-hetero structure, which is a standard LD structure, a lower contact layer 4, made of n-GaN, and an upper contact layer 10, made of p-GaN, are respectively provided, in order to reduce the ohmic resistance of the electrodes. The n-GaN contact layer 4, first grown on the sapphire substrate, is laterally extended and a lower electrode 3 for operating-current supply is formed on the extended part of the n-GaN contact layer 4. In FIG. 1, an SiO$_2$ film, 11, which is formed by etching in the form of stripe, constricts the current supplied to the active layer 7 into the area under the aforementioned stripe. Thus, the SiO$_2$ film serves as a current blocking insulator film for reducing the operating current. The n-GaN contact layer 4 has a sheet resistance in the lateral direction, so that a potential drop occurs in the lateral direction to the n-GaN contact layer 4 serving as a cathode of the device.

It is desirable that the current density distribution be longitudinally uniform between the anode and the cathode of the device. However, in the device (FIG. 1), which is characterized by the side injection structure, consisting of an insulating substrate and multiple-layer compound semiconductor formed thereon, the passage of the operating current is significantly skewed toward the mesa edge on which the side injection electrode 3 is provided.

The skewed current-path has an effect on the light emission pattern, as shown in FIG. 2. The lengthwise width of the active layer 7 shown in FIG. 1 is plotted on the abscissa. Plotted on the ordinate is the output light intensity which is measured near the aperture of the active layer 7.

As is indicated by a solid line in FIG. 2, a skewed current density distribution, due to the skewed current-path described above, results in an nonuniform distribution of the output light intensity and adversely affects LD performance.

In particular, in the case where the GaN-based multiple-layer structure is constructed in the inverse order from that in FIG. 1, by growing the p-GaN layer first on a sapphire substrate and providing a side injection electrode on the first-grown p-GaN layer, due to the hole mobility being so low, the above effect is even stronger. Hence, a LD or LED having such a structure tends to have a high operating voltage and the current density distribution is skewed even more.

Accordingly, to attain a desired LD or LED working at a low voltage, it may be better to use a conductive substrate such as SiC, since it lattice matches with the GaN-based compound.

However, SiC is expensive and it is impossible to obtain a single crystalline SiC having a large enough diameter required for a large-scale production. When GaN layer is grown onto the SiC substrate, no barrier for electron current is produced in theory. However, in practice, the interface between the GaN layer and the SiC substrate tends to become highly-resistant to the electron current flow. This highly-resistant interface layer results from an adverse interface reaction between the SiC substrate and the GaN layer.

For this reason, an inexpensive sapphire substrate has been used heretofore in the GaN-based semiconductor devices. However, 16% of a lattice mismatch is present between the GaN layer and the sapphire substrate, producing a large lattice strain in the GaN growth layers. These lattice strains develop into lattice defects in the growth layer. This is one of the reasons why it has been difficult to manufacture practical GaN-based LD's and LED's.

Since sapphire is an insulating substrate, a side injection electrode for current supply has to be provided on the first-formed n-GaN layer on the sapphire substrate. Even if a relatively-low-resistant n-GaN layer is used as the side injection layer, the resultant LD and LED formed on the sapphire substrate and provided with the side injection structure will have a large device resistance, compared to the case where the conductive substrate is used. As a result, the operating voltage is increased.

As described above, problems are present not only in the lower electrode but also in the upper electrode. Due to the high operating current density, metallic atoms of small-atomic radii forming the electrode easily migrate into the GaN layer or into a mixed crystal, degrading the working function of the semiconductor device. The problem of electromigration is not always caused by metallic atoms having small-atomic radii alone. In an attempt to prevent this electromigration, a metallic material having large atomic radii, like a barrier metal, was employed as an electrode instead of metallic atoms having small-atomic radii. However, this attempt was unsuccessful. Hence, electromigration still remains a difficult problem to be solved.

The GaN-based material has a drawback in that its dislocation density is high, of the order of $10^8$ cm$^{-2}$, and has a tendency to propagate particularly in the direction of crystal growth. As shown in FIGS. 3A and 3B, when Au is used, for example, as an electrode material, Au ions are deposited along the dislocation line via electromigration caused by the flow of electric current. When the Au deposition gets deep enough into the crystal and dense enough, short-circuit of the GaN based multilayered structure occurs, causing a catastrophic failure of the semiconductor device. FIG. 4 is a schematic cross-sectional view of a GaN-based LD having a failure due to a short. The profile of the Au ions transported by the current can be microscopically observed.

As is mentioned above, the conventional semiconductor device having the side injection structure has two problems. One is the generation of excessive operating voltage due to high series resistance. The other is the migration of metal atoms from the upper electrode into semiconductor layers due to highly-dense operating current and the high dislocation density.

BRIEF SUMMARY OF THE INVENTION

The present invention has been made with a view towards solving the aforementioned problems.

An object of the present invention is to provide a semiconductor device formed on an insulating substrate whose operating voltage is greatly reduced by providing a conductive oxide layer with an extremely-low resistivity to the interface between the insulating substrate and a GaN-based growth layer or a ZnSe-based growth layer, to the interface between the growth layer and a metal electrode, to the interface between the insulating substrate and a metal electrode for side injection, or to the interfaces between the individual growth layers.

Another object of the present invention is to provide a long-life semiconductor device by preventing metal-atom migration from the upper electrode of the GaN-based or ZnSe-based semiconductor device formed on an insulating substrate.

The semiconductor substrate of the present invention is characterized in that the operating voltage of the semiconductor device formed on an insulating substrate such as sapphire is greatly reduced by employing, as the conductive oxide layer, conductive ZnO highly doped with Al which exhibits a good ohmic property relative to p-GaN and n-GaN based or p-ZnSe and n-ZnSe based compound semiconductors.

A semiconductor device with the property of continuously working for a long time can be attained by providing a conductive ZnO layer doped with a significant amount of Al between the upper metal electrode and a GaN-based or ZnSe-based compound semiconductor layer to prevent the electromigration of metallic atoms from the upper electrode, caused by high operating current densities in conjunction with high dislocation densities, thereby suppressing abrupt device breakdown normally seen in semiconductor devices formed on insulating substrates.

The operating voltage can be further reduced by employing the conductive ZnO layer doped with a significant amount of Al as a buffer layer between a conductive substrate such as SiC and the GaN-based or ZnSe-based compound semiconductor layer. In this case, if the conductive ZnO layer is formed between the upper electrode and the compound semiconductor layer, the electromigration of metallic atoms from the upper electrode can be prevented, enabling continuous operation of the semiconductor device formed on a conductive substrate to be obtained for a long time.

As is described above, if the Al-doped ZnO layer having a low resistance is used to form an ohmic contact to the semiconductor device formed on an insulating substrate such as sapphire or a semiconductor device formed on a conductive substrate such as SiC, it is possible to attain a long-life semiconductor device which can be operated at a significantly reduced operating voltage and with a low power-consumption.

Besides these, superlattice layers consisting of a plurality of Al-doped ZnO layers and GaN layers may be used as optical guide layers adjacent to an InGaN active layer. Alternatively, a superlattice layer consisting of a plurality of undoped ZnO layers and InGaN layers may be used as the active layer and GaN layers as the optical guide layers adjacent to the active layer. Also, a short period superlattice layer consisting of a plurality of undoped ZnO layers and InGaN or InN layers may be used as the active layer.

The same advantages offered by the Al-doped ZnO layer or the undoped ZnO layer can be obtained not only by GaN-based compound semiconductor layers made of GaN, AlGaN, InGalN and InGaN but also by nitride semiconductor layers made of AlN, InN, and InAlN, as well as by ZnSe and ZnS based compound semiconductor layers made of ZnSe, ZnS, ZnSSe, MgZnSe, MgZnSSe, and CdZnSe.

Other than the Al-doped ZnO layer, the conductive oxide films to be used herein include InZnO, Al-doped InZnO, SnZnO, Al-doped SnZnO, InSnZnO, and Al-doped InSnZnO.

According to the method of producing a semiconductor device of the present invention by use of the Al-doped ZnO layer or undoped ZnO layers, a good single crystalline layer can be grown on a single crystal substrate such as sapphire or SiC or on the compound semiconductor layer grown on the single crystal substrate, by means of MBE (Molecular Beam Epitaxy), MOCVD (Metal Organic Chemical Vapor Deposition), CVD (Chemical Vapor Deposition), or LPE (Liquid Phase Epitaxy).

In the case where the Al-doped ZnO layer is formed between a metal electrode and a compound semiconductor layer, Al-doped polycrystalline ZnO may be deposited by electron beam evaporation or sputtering.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

The present invention is best understood by reference to accompanying drawings, in which:

FIG. 3B is a partially magnified view showing the migration of Au atoms from an electrode into a dislocation line;

FIG. 14 is a cross-sectional view showing a structure of a ZnSe-based LD formed on a GaAs substrate, according to a fifth embodiment of the present invention;

FIG. 15 is a diagram showing the relationship between ZnSe, ZnO and SiC band structures;

FIG. 20 is a cross-sectional view showing a typical GaN-based device with a ZnO/GaN short period superlattice optical guide layers.

FIG. 21 is a cross-sectional view showing a typical GaN-based device, with Al-doped ZnO contact layers and a ZnO/GaN short period superlattice optical guide layers.

FIG. 22 is a cross-sectional view showing a typical GaN-based device with a ZnO/InGaN short period superlattice active layer and ZnO/GaN short period superlattice optical guide layers.

FIG. 23 is a cross sectional view showing a typical GaN alloy based device, with Al-doped ZnO contact layers, a ZnO/InGaN short period superlattice active layer and ZnO/GaN short period superlattice optical guide layers.

FIG. 25 is a band diagram of the active layer a in a long wavelength GaN-based laser with a ZnO/InN short period superlattice active layer.

DETAILED DESCRIPTION OF THE INVENTION

Hereinbelow, embodiments of the present invention will be described in detail with reference to the accompanying drawings.

Figure 5:
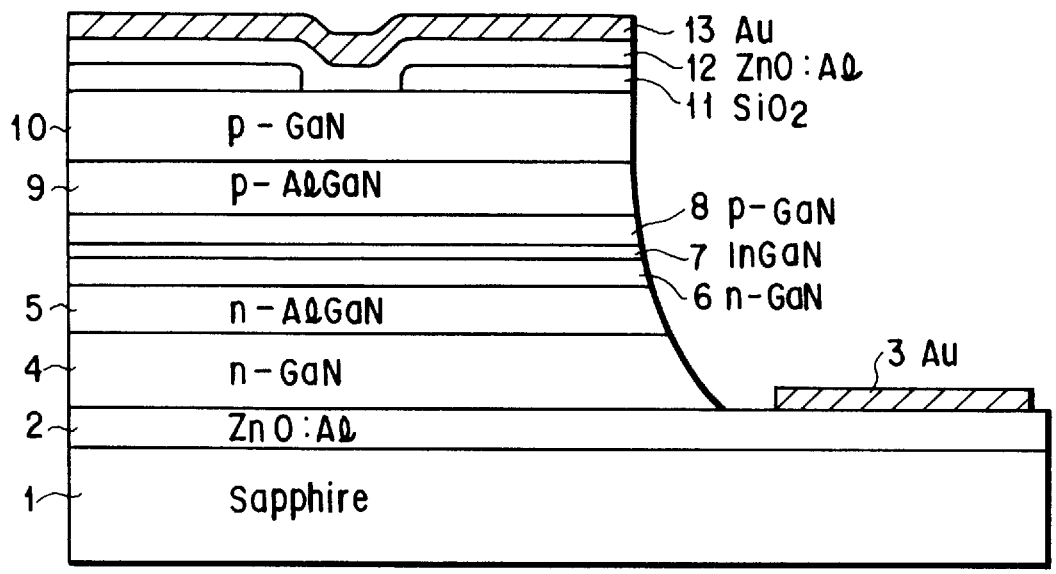
FIG. 5 is a cross sectional view showing a structure of the GaN-based LD according to a first embodiment of the present invention.

FIG. 5 is a cross-sectional view showing a structure of a GaN-based LD according to a first embodiment of the present invention.

A GaN-based multiple-layer structure is formed as follows. In the first place, a low-resistance conductive ZnO buffer layer 2 doped with a significant amount of Al is grown on a sapphire substrate. Thereafter, an n-GaN contact layer 4 is grown on the resultant structure. In this way, a good ohmic contact is provided between the ZnO buffer layer 2 and the n-GaN contact layer 4. As is shown in FIG. 5, a lower electrode 3 (provided to the multiple-layer structure) made of Au is formed on the ZnO layer 2 which is extended along the surface of the sapphire substrate 1. The electronic contact properties between the electrode 3 and the ZnO layer 2 are improved since the ZnO layer has acquired metallic like characteristics due to the addition of Al.

In the first embodiment of the present invention, an upper electrode 13 made of Au is formed on an underlying layer. As the underlying layer, a ZnO layer 12 doped with a significant amount of Al is formed on a p-GaN contact layer 10, and then the Au electrode 13 is formed on the layer 12. By overlying the conductive ZnO layer 12 on the p-GaN contact layer 10, the contact resistance exhibited by the upper electrode 13 can be significantly reduced, compared to the conventional case using no underlying ZnO layer 12.

Figure 6:
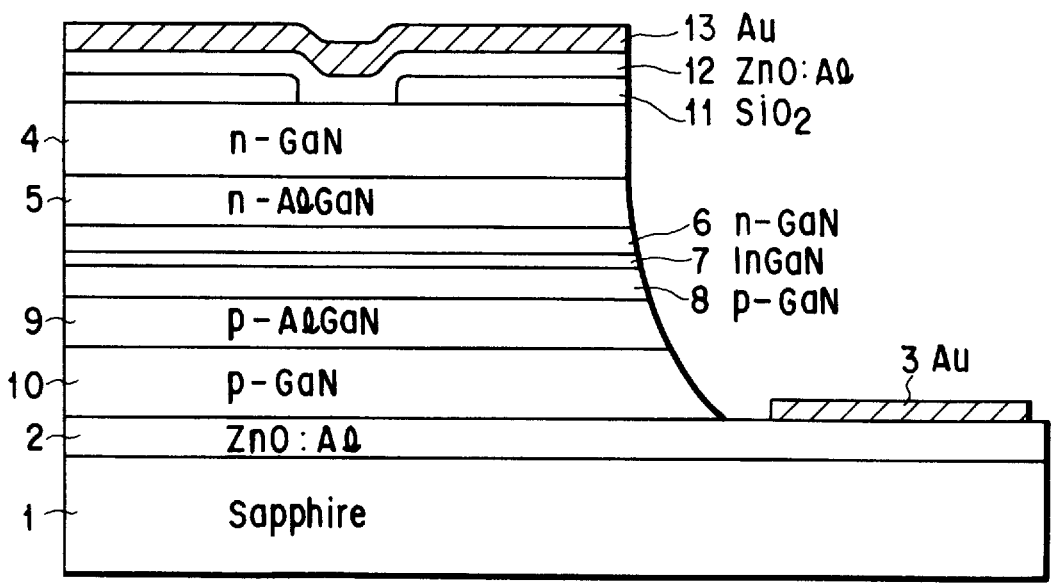
FIG. 6 is a cross sectional view showing a modified structure of the GaN-based LD according to a first embodiment of the present invention.

As is described above, if the upper and lower electrodes are formed on conductive ZnO which resistance is reduced by doping with a significant amount of Al (hereinafter, referred to as "Al-doped ZnO"), the operating voltage of a GaN-based LD or LED, formed on a sapphire substrate, can be markedly reduced. The cross sectional view of FIG. 6 shows such a GaN-based multiple-layer structure formed on an Al-doped ZnO layer in the inverse order of that shown in FIG. 5. To be more specific, the growth of the nitride layers is started from the p-GaN layer in FIG. 6.

Figure 1:
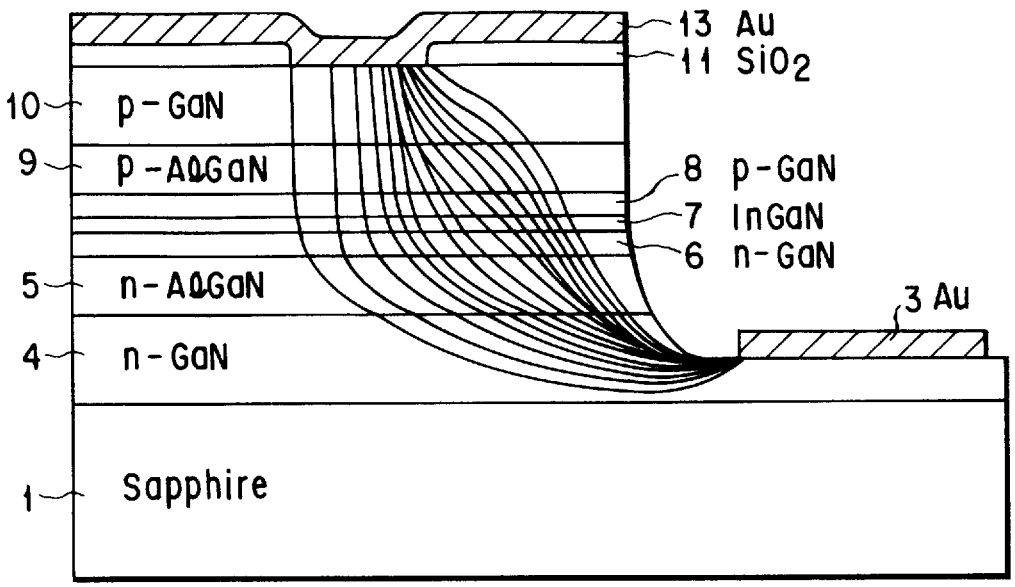
FIG. 1 is a cross sectional view showing a structure of a conventional GaN-based LD formed on a sapphire substrate.
Figure 2:
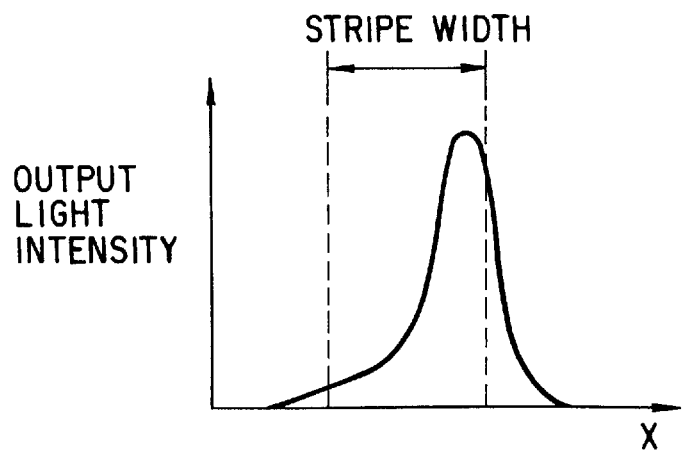
FIG. 2 is a graph showing a light emission pattern of a conventional GaN-based LD.
Figure 3A:
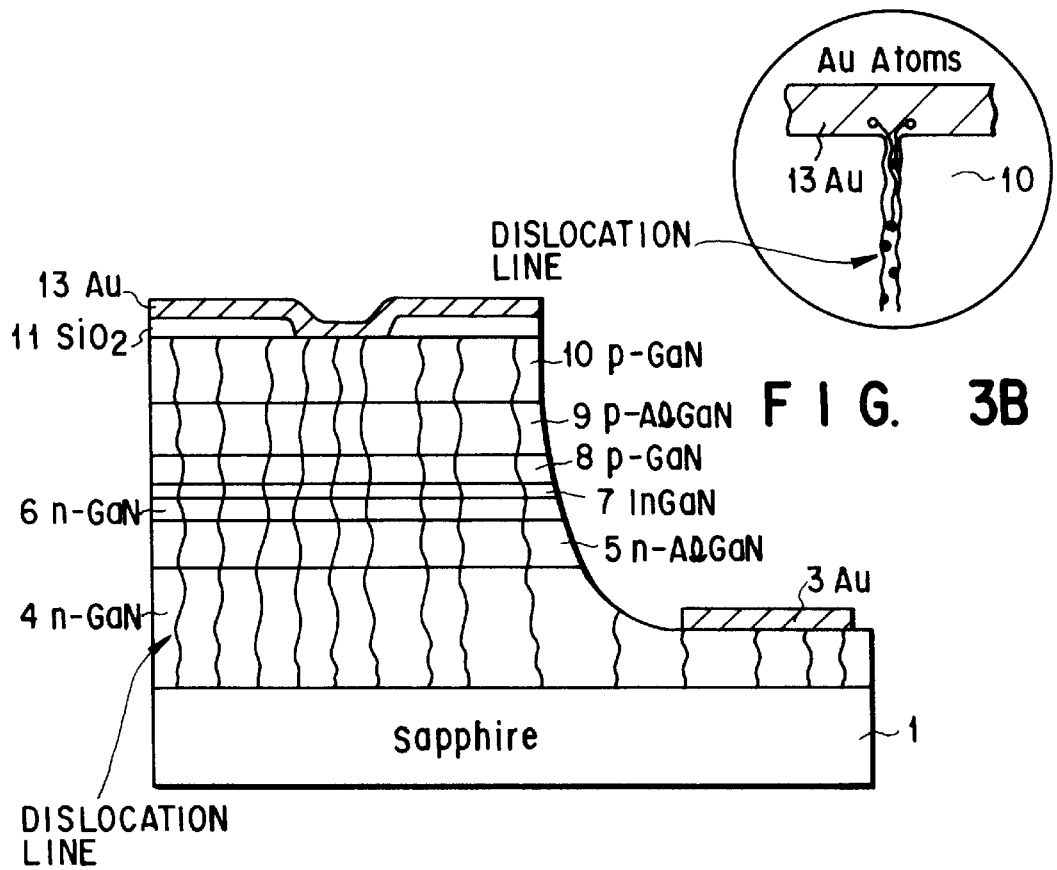
FIG. 3A is a view showing the relationship between dislocations, in a conventional GaN-based LD formed on a sapphire substrate, and the migration of Au atoms.
Figure 4:
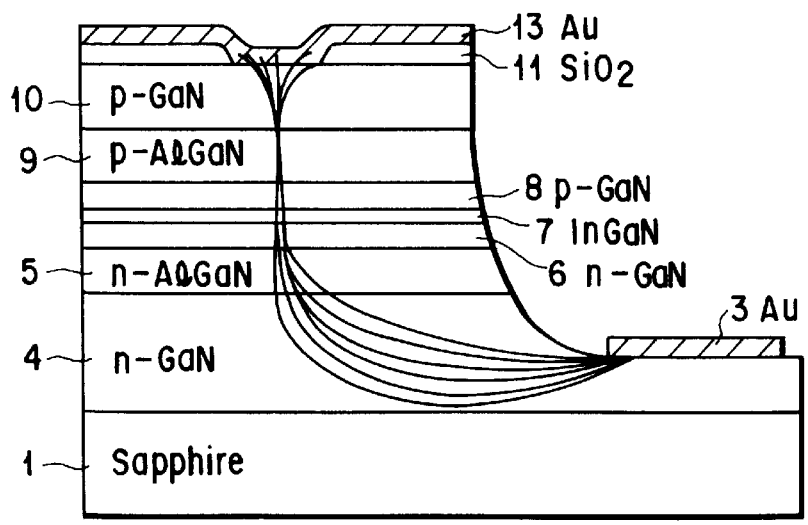
FIG. 4 is a view showing the relationship between the migration of Au atoms and current distribution in a conventional GaN-based LD formed on a sapphire substrate.
Figure 7:
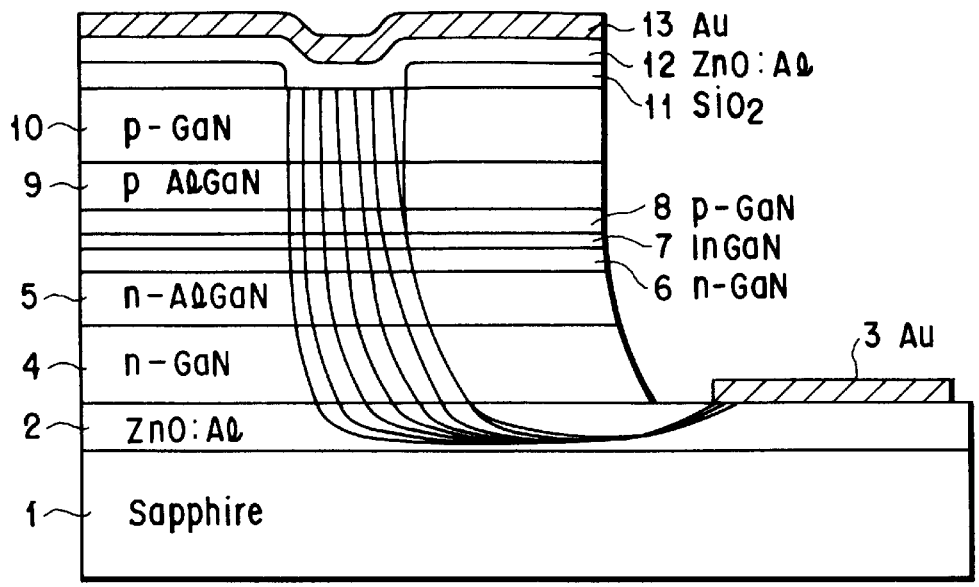
FIG. 7 is a diagram showing inner current density distribution of the GaN-based LD according to a first embodiment of the present invention.
Figure 8:
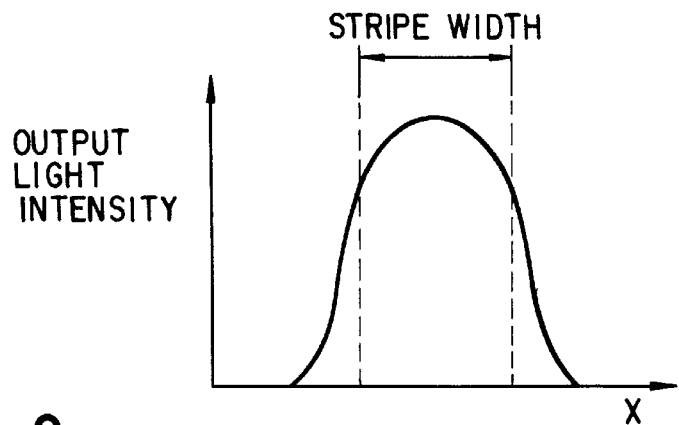
FIG. 8 is a graph showing a light emission pattern of the GaN-based LD according to a first embodiment of the present invention.

The cross sectional view of the GaN-based LD depicted in FIG. 7 shows the improved current density distribution due to the introduction of an Al-doped ZnO buffer 2. Since the Al-doped ZnO buffer layer 2, due to its low resistance, serves as a near equipotential surface on the cathode side of the device, the current density distribution of the multiple-layer structure is greatly improved, compared to the conventional GaN-based LD in FIG. 1. Consequently, the resulting light emission pattern becomes normal, as shown in FIG. 8, compared to the conventional pattern shown in FIG. 2. In a GaN-based LD exhibiting a good symmetrical light emission pattern, the optical gain within the active layer is large, the emission mode is stable, and the astigmatism is small. By virtue of these advantages, the GaN-based LD is suitable for use in reading and writing a highly-dense optical record and is capable of working continuously for a long time.

In FIGS. 5 and 6, the Al-doped ZnO buffer layer is directly provided on the sapphire substrate and laterally extended along the substrate. On the extended Al-doped buffer layer, a side injection electrode is formed. However, it is not necessary to contact the Al-doped ZnO buffer layer on the sapphire substrate directly. The side injection electrode 3 may be formed on the n-GaN contact layer 4 on a Al-doped ZnO buffer region on a sapphire substrate. In this case, the n-GaN contact layer 4 on which the side injection electrode 3 is formed must be left when the multiple-layers are processed into a mesa stripe structure. In this structure, the contact resistance between the side injection electrode 3 and n-GaN contact layer 4 increases. However, the ZnO buffer layer 2 low in sheet resistance is present underneath the GaN contact layer and the resistance of the n-GaN contact layer in the extending direction can be significantly reduced, compared to the resistance exhibited by the conventional structure in which the lower electrode is formed on the extended surface of the n-GaN contact layer alone.

Figure 9:
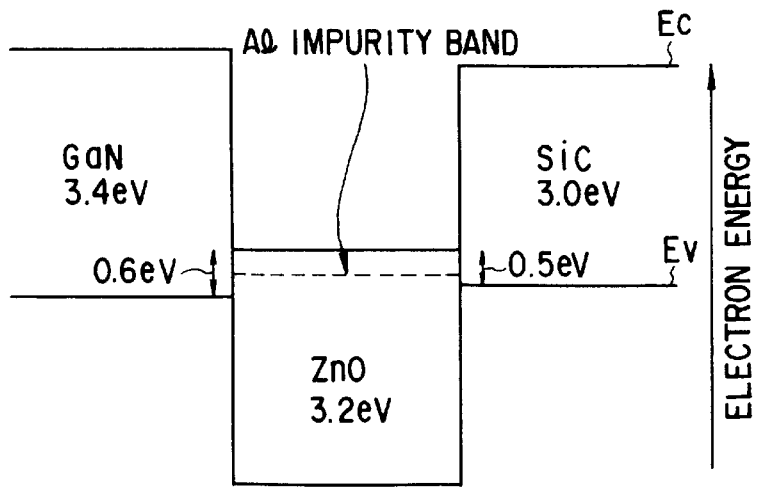
FIG. 9 is a view showing the relationship between GaN, ZnO, and SiC band structures.

Hereinbelow, a second embodiment of the present invention will be described with reference to FIGS. 9 and 10. FIG. 9 shows an energy band structure when the Al-doped ZnO layer and the GaN layer are continuously grown on a SiC substrate. As shown in FIG. 9, the band gaps of SiC, ZnO, and GaN are 3.0 eV, 3.2 eV and 3.4 eV, respectively. $E_C$ and $E_V$ represent the energy values of the bottom of a conduction band and the top of a valence band, respectively. The ZnO energy bands are significantly lower than the SiC and GaN bands. The bottom of the ZnO conduction band is connected to the top of the GaN valence band at a position 0.6 eV higher than the top of the GaN valence band.

If a p-ZnO layer is obtained, the hole injection from the p-ZnO layer to the GaN layer can be easily carried out since no barrier to holes is present. However, it is not possible to grow the p-ZnO layers by presently known techniques. Therefore, the p-ZnO layers cannot be used as a material for making ohmic contacts to p-GaN.

However, when the ZnO layer acquires metallic characteristics by doping with Al in several percent, no highly resistant region, to hole current flow, is produced, although such a high resistance region is usually generated when holes are forced to flow through an n-ZnO layer into a p-GaN layer. When Al is doped into the ZnO layer in a significant amount, a metallic like impurity band, as shown in FIG. 9, is produced immediately under the ZnO conduction band. In this case, since the energy value of the impurity band is close to that of the top of the GaN valence band, holes flow through the impurity band into the p-GaN, forming an ohmic contact to p-GaN. Although a barrier of 0.3 to 0.4 eV still remains on the tops of the impurity band and the GaN valence band, holes can overcome the barrier at room temperature in consideration of doping concentration of p-GaN and the thermal energy.

From the discussion in the foregoing, it is generally conceivable that an ohmic contact to the n-GaN layer cannot be formed via the ZnO conduction band due to the energy difference from the GaN conduction band being 2.5 eV or more. However, n-GaN can be heavily doped, in the order of an electron concentration of $10^{19}$ $cm^{-3}$. The related depletion layer therefore becomes thinner, enabling electrons to pass through the barrier due to the tunnel effect. The ZnO layer can thus be used as an ohmic contact to n-GaN layers at room temperature. In the similar manner, the ZnO layer can be used as an ohmic contact material to SiC.

Alternatively, the ohmic contacts to the n-GaN and SiC may be formed by directly alloying the metal electrode. However, due to thermal stress associated with the alloying, defects are produced in the GaN nearest the electrode. As the defects proliferate towards the inner portion of the GaN-based multiple-layer structure, the lifespan of the device decreases. When the Al-doped ZnO layer is used as a material for an ohmic contact, the GaN layer in contact with the ZnO layer is free from defects ascribed to thermal stress since the ZnO layer can be grown at temperatures as low as 300° C. Besides this, heat treatment for stabilizing the ohmic properties is not required.

Figure 10:
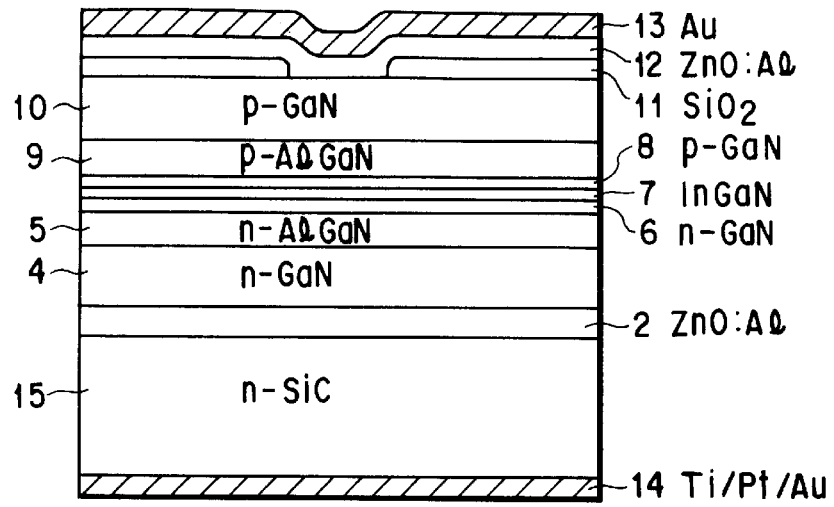
FIG. 10 is a cross-sectional view showing a structure of the GaN-based LD formed on a conductive n-SiC substrate, according to a second embodiment of the present invention.

FIG. 10 is a cross sectional view of a structure of a GaN-based LD formed on an n-SiC conductive substrate having an Al-doped ZnO ohmic contact. The Al-doped ZnO layer 2 is formed between an n-SiC substrate 15 and an n-GaN contact layer 4. The Al-doped ZnO layer 12 is formed between a p-GaN contact layer 10 and an upper metal electrode 13 made of Au.

Since the Al-doped ZnO layer has a wurtzite structure and a lattice constant close to that of a SiC crystal and GaN-based crystal, the Al-doped ZnO layer acts as a buffer layer when the GaN layer is grown on the SiC substrate. By interposing a heterogeneous ZnO layer, a good ohmic contact is obtained. Besides this, a less-defective and good-quality GaN growth layer can be obtained, compared to the case in which the GaN layer is grown directly on the SiC layer.

As is apparent from FIG. 9, the difference in energy value between the bottoms of GaN and SiC conduction bands is only 0.4 eV, but the difference between the bottoms of ZnO and GaN conduction bands reaches 2.5 eV or more. From this fact, it is considered that the ohmic properties can be rather readily obtained in the case where the GaN layer is connected directly to the SiC layer. As a matter of fact, when the GaN layer is grown directly on the SiC substrate, the GaN growth layer appears to have a good crystallinity in its appearance, in comparison with the case where the GaN layer is grown on sapphire. However, there is a drawback in this case. The interface between the GaN growth layer and the SiC substrate becomes highly resistant. This is caused by an insulating interfacial layer, such as an $SiN_x$ layer, formed by the reason that the reactivity of nitrogen (serving as a gas source material for the gas phase growth) to Si (serving as a constitutional element of the SiC substrate) is higher than its reactivity to Ga.

As is described above, the Al-doped ZnO layer contributes to stabilizing and keeping the surface of the SiC substrate clean, and lattice-matches to both SiC and GaN, attaining a low-resistance contact. The second embodiment deals with the case where the GaN-based multiple-layer structure is formed by growing an n-type layer first on an n-SiC substrate. If the GaN-based multiple-layered structure is formed by growing a p-type layer first on a p-SiC substrate, the GaN-based LD can be also obtained with good properties.

Figure 11:
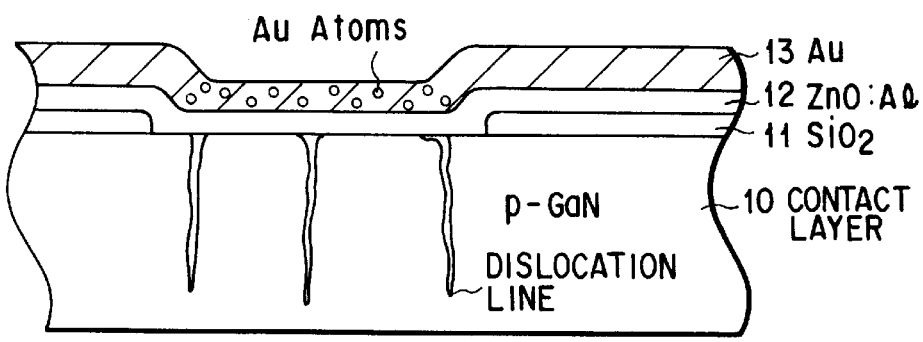
FIG. 11 is a partially-magnified view, for explaining the barrier effect of an Al-doped ZnO layer on electrode metal migration, according to a third embodiment of the present invention.
Figure 12:
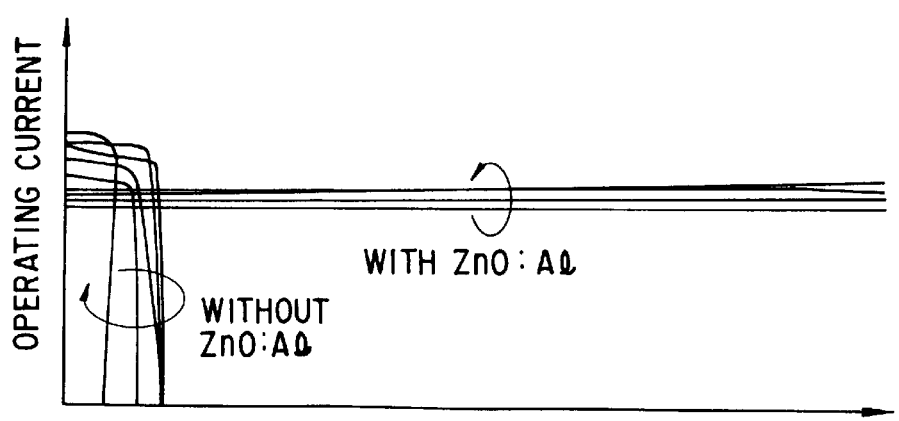
FIG. 12 is a graph exhibiting the life-improving effect of an Al-doped ZnO layer.

Referring now to FIGS. 11 and 12, a third embodiment of the present invention will be described.

FIG. 11 is a partially-magnified view of the top portion of LD or LED having the GaN-based multiple-layered structure. In this figure, if the Al-doped ZnO layer is formed between an upper Au electrode 13 and a p-GaN contact layer 10, Au atoms constituting the electrode 13 can be prevented from electromigrating into the dislocation lines of the p-GaN layer. The Al-doped ZnO layer is not only used for improving the ohmic properties, but also is used as a barrier to metal-ion migration which prevents metal ions from entering and propagating dislocation lines and thus prevents degradation of the device. As is mentioned, due to the presence of the Al-doped ZnO layer formed between the upper Au electrode 13 and the p-GaN contact layer 10, the current is quite stable instead of the abrupt change observed in the conventional device.

FIG. 12 is a schematic graph showing degradation of the GaN-based LD. In the graph, the effects of the presence and absence of the Al-doped ZnO layer between the upper Au electrode and the GaN contact layer are compared. Time is plotted on the abscissa of the graph. Plotted on the ordinate is the operating current measured under the conditions in which the output light power is kept constant by Automatic Power Control. Accordingly, the change in operating current with the passage of time is shown. Great improvement is found in the operating current of the GaN-based LD having the Al-doped ZnO layer, compared to the conventional one in which the Au electrode is produced directly on the p-GaN layer.

Instead of the Al-doped ZnO layer, it may be considered effective to use a barrier metal made of a metal material, such as Cr, Pt, or Ti, whose atomic radius is too large to migrate easily into GaN. However, unlike the Al-doped ZnO layer, such a barrier metal cannot prevent the migration completely since the GaN-based materials have very high dislocation densities of individually large physical size.

Now, referring to FIG. 13, a fourth embodiment will be explained.

Figure 13:
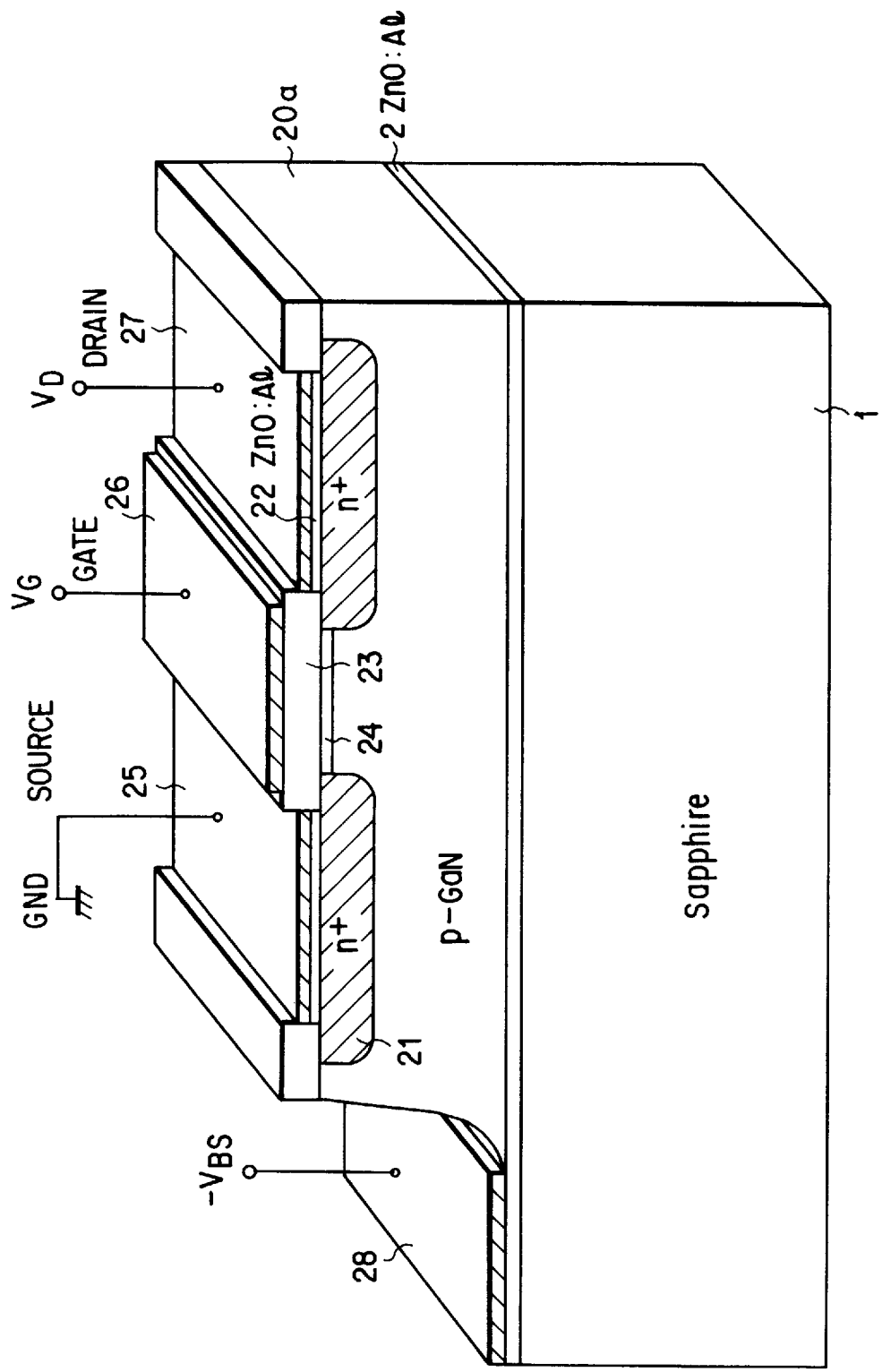
FIG. 13 is a bird's-eye view showing a structure of MOSFET made of p-GaN formed on a sapphire substrate, according to a fourth embodiment of the present invention.

FIG. 13 is a bird's-eye view showing a structure of GaN-MOSFET formed on a sapphire substrate. The Al-doped ZnO buffer layer 2 is grown on a sapphire substrate 1. On the layer 2 is formed an p-GaN layer 20a serving as the bulk of the GaN-MOSFET. In the p-GaN layer 20a, $n^+$ regions, serving as a source and a drain, are formed. Metal electrodes 25 and 27 are then formed on the source and drain via an Al-doped ZnO layer 22. Between the metal electrodes 25 and 27, a gate insulating film 23 is formed. Furthermore, a gate electrode 26 for controlling a channel 24 is formed on the gate insulating film 23. The source electrode is grounded (GND) and voltage $V_G$ and $V_D$ are applied to the gate and drain electrodes, respectively.

A part of the p-GaN layer 20a acting as the MOSFET bulk, is removed by mesa-etching and a substrate voltage control electrode 28 is formed on the Al-doped ZnO layer 2. The Al-doped ZnO layer 22 formed under the source and drain electrodes plays a role in preventing migration of metal-atoms from the metal electrode into the p-GaN region. The Al-doped ZnO buffer layer 2 formed on the sapphire substrate 1 not only improves the crystallinity of the p-GaN substrate 20a but also helps the uniform application of substrate voltage ($V_{BS}$) over the entire region of the p-GaN MOSFET region 20a. In the case where no ZnO:Al 2 buffer region is used, the p-GaN layer 20a having a high resistance, the potential drop cannot be uniform across the whole gate region but is concentrated at the mesa between the lower 28 and upper 25 electrodes, thus preventing a normal operation of the MOSFET. However, if the conductive Al-doped ZnO layer 2 is first formed on the sapphire substrate, no such problem arises and the potential drop is uniform across the same region, ensuring the normal MOSFET operation.

Now, referring to FIGS. 14 to 17, a fifth embodiment of the present invention will be described.

In the foregoing, we described the cases where the Al-doped ZnO layer and other related oxide contact layers are applied to devices comprised of the GaN-based compounds. However, their uses are by no means limited to these range of compounds and are applicable to other semiconductor systems.

Such a system is the one based on the II–VI compounds. The first example is for a ZnSe-based device lattice-matched to GaAs which acts as the substrate, as is shown in FIG. 14.

In FIG. 14, reference numeral 35 is a CdZnSe active layer, numerals 34 and 36 are ZnSe optical guide layers. Numerals 33 and 37 denote MgZnSSe cladding layers and numerals 31 and 32 are buffer layers between the GaAs substrate and a lower MgZnSSe cladding layer 33. The Al-doped ZnO layer 12 is formed between an upper Au electrode 13 and a p-ZnSe layer 38 formed on an upper MgZnSSe cladding layer 37.

In ZnSe based LD's, the major problem is the lack of an ohmic contact to p-ZnSe, because of which such devices still have larger than expected operation voltages and thus shorter lifetimes due to the production of excess heat caused by the excess voltages.

The problem mainly concerns the fact that metals used for contacts, have work functions appreciably higher than the valence band of ZnSe. Appropriate semiconductors that could act as intermediate regions between the valence band of ZnSe and metal contacts unfortunately are difficult to p-type dope or have valence bands of at least 1 eV shallower than that in ZnSe.

The use of Al-doped ZnO overcomes these problems as is shown in FIG. 15. Here the band offset between the Al impurity band in ZnO and the valence band of ZnSe is extremely small, in the order of 0.02 eV, thus making the contact an ohmic one at room temperature.

A device using this technology is shown in FIG. 14 with Al-doped ZnO layer 12 being deposited onto the final p-ZnSe layer 38 of a ZnSe LD. Although the resultant Al-doped ZnO layer 12 is polycrystalline rather than single crystal, due to the fact that these ZnSe semiconductors are of a different lattice type from Al-doped ZnO, cubic for ZnSe as opposed to wurtzite for ZnO, this matters little as the layer only acts as a metallic like contact to the p-ZnSe and its lack of crystallinity in no way interferes with this process.

Figure 16:
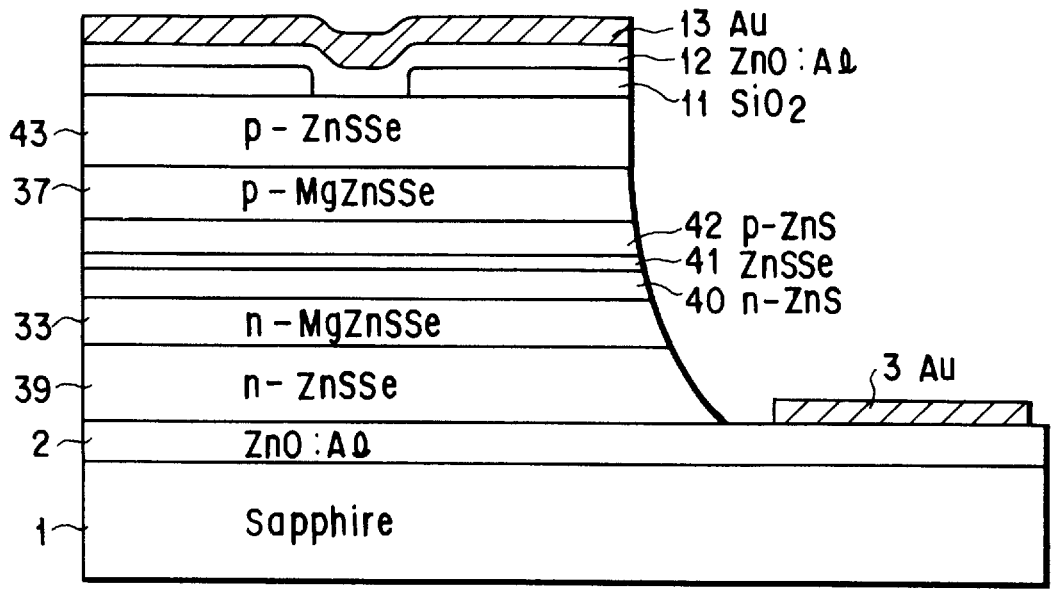
FIG. 16 is a view showing a structure of a ZnSe-based LD formed on a sapphire substrate, according to a fifth embodiment of the present invention.

FIG. 16 is a cross sectional view of a ZnSe-based LD formed on a sapphire substrate employing the Al-doped ZnO layer. ZnS optical guide layers 42 and 40 are formed adjacent to the upper and the lower sides of a ZnSSe active layer 41. Further adjacent to the upper and the lower sides of the resultant structure, cladding layers 37 and 33 made of MgZnSSe are formed. Moreover, contact layers 43 and 39 made of ZnSSe are formed adjacent to the upper and the lower sides of the resultant structure. Between the lower ZnSSe contact layer 39 and the sapphire substrate 1, an Al-doped ZnO layer 2 is formed. Between the upper ZnSSe contact layer 43 and an upper Au electrode, an Al-doped ZnO layer 12 is formed.

FIG. 16 may seem to contradict the final part of the above paragraph as we are growing single crystalline ZnSSe 39 on top of Al-doped ZnO 2. However, in this case the ZnSSe 39 has a very high percentage of sulphur, such as $ZnS_xSe_{1-x}$ (0.7<x<1), meaning that the crystal type changes from cubic to wurtzite and it is in this latter form that it can be grown onto wurtzite ZnO or wurtzite sapphire. The device shows an ultraviolet LD based on these wurtzite based II–VI compounds.

The Al-doped ZnO 2 in this case acts as a low resistance contact to the lower n-ZnSSe contact region 39 of the device resulting in uniform emission across the laser stripe region not obtainable without the Al-doped ZnO region 2. Due to high resistivity of the n-ZnSSe 39 the use of the lower Al-doped ZnO 2 in this case also results in a reduction of the overall device resistance and thus lowers the operating voltages of the devices and substantially reduces the generation of excess heat which leads to short device lifetimes.

Figure 17:
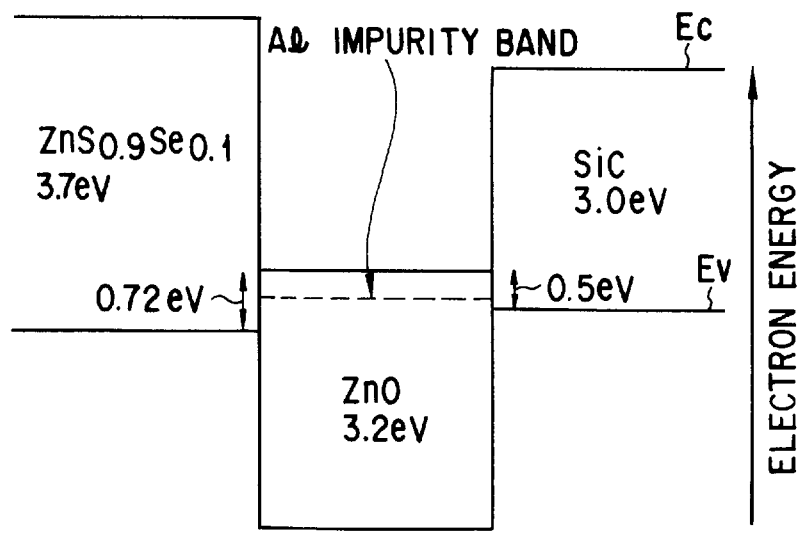
FIG. 17 is a diagram showing the relationship between ZnSSe, ZnO, and SiC band structures.

Note that, as shown in FIG. 17, the Al-doped ZnO layer can be used as a low resistivity region between a SiC substrate and a high sulphur content ZnSSe device. Although the valence band offset is 0.72 eV, the use of the impurity band in Al-doped ZnO lowers the barrier by about one half. This means that since SiC substrates are conducting, non lateral structures can be constructed in the semiconductor system.

Hereinbelow, a sixth embodiment of the present invention will be explained.

In the first to fifth embodiments, it has been explained that the Al-doped ZnO layer is used either as an underlying layer of a metal electrode for supplying operating current to a semiconductor device or as a buffer layer for growing an epitaxial layer made of a compound semiconductor on a single crystalline substrate. However, the use of the Al-doped ZnO layer is not limited to the aforementioned ones.

As shown in FIGS. 5, 6, and 10, if the n-GaN layer 6 and p-GaN layer 8, serving as the optical guide layers sandwiching the InGaN active layer 7, are replaced with the following optical guide layers: one is an n-superlattice consisting of plurality of Al-doped ZnO layers and n-GaN layers, and the other is a p-superlattice consisting of plurality of Al-doped ZnO layers and p-GaN layers, it is possible to reduce the lasers threshold current densities and raise the maximum operating output power of the devices. This is due to an improvement in the device efficiency.

In this case, the composition of the InGaN active layer 7 is defined by the following formula:

$In_xGa_{1-x}N$ (0.1≦x≦0.3)

At this point, if an Al-doped ZnO layers 2 and 12 are introduced, as shown in FIGS. 5, 6, and 10, series resistance of a light emitting device can be further reduced.

Alternatively, if the InGaN active layer 7 is replaced with a superlattice active layer consisting of an undoped ZnO layer and an $In_xGa_{1-x}N$ (0≦x≦0.3) layer and further the n-GaN layer 6 and p-GaN layer 8 are used as the optical guide layers, the devices efficiency can be significantly enhanced.

Furthermore, it is a matter of course that if the Al-doped ZnO layers 2 and 12 are introduced as shown in FIGS. 5, 6 and 10, series resistivity of the semiconductor light emitting device can be reduced.

Hereinbelow, referring to FIGS. 18 to 28, a seventh embodiment of the present invention will be explained.

In the sixth embodiment, it was explained that the superlattice layer containing ZnO is introduced to the active layer and the guide layer. However, the use of ZnO is not limited to this. As shown below, if an appropriate type of a compound semiconductor thin film is chosen as a constitutional element of the super lattice layer and used in combination with a ZnO thin layer, and if the superlattice layer constituted of plurality of thin films is formed extremely-thin in the order of several nm, a band folding type superlattice layer can be obtained. By virtue of the presence of the band folding type super lattice layer, a GaN-based light emitting device emitting light of long wavelengths can be realized, although it has been hitherto difficult to obtain such a device.

Hereinafter, the band folding type superlattice formed of a plurality of extremely-thin layers and acting like a single semiconductor material due to intermixture of two band structures, will be referred to as "short period superlattice".

In the seventh embodiment, a short period superlattice formed of ZnO and $In_xGa_{1-x}N$ (0.1≦x≦0.3) or InN is used as an active layer. A short period super lattice formed of ZnO and GaN is used as a guide layer. With this structure, it is possible to obtain a GaN-based semiconductor light emitting device which is capable of emitting light of longer wavelengths than a conventional one while maintaining the ability of emitting light of the short wavelengths with high efficiency.

In addition, the application of the short period superlattice serving as a guide layer to an LD having a general structure, makes it possible to obtain the LD which can be operated with high power and the LD which can be efficiently operated with an overflow current suppressed. Hitherto, such LDs have not been achieved.

From the first successful p-type doping of GaN with Mg many workers have constructed devices with the idea of producing commercially viable lasers in the ultraviolet and blue regions of the visible optical spectrum.

However, although limited lasing has been achieved there remains many problems to be overcome. One of the main problems is that the wavelength range over which lasing has been achieved is very limited, to around about 390 nm to 420 nm. The main reason for this is that the active layers are constructed from $In_xGa_{1-x}N$ alloys where x is in the range, in theory, 0.1 to 1.0. This spans the visible spectrum from ultraviolet to red light and should make the GaN system one of the most flexible of all laser semiconductor systems.

However, as the concentration of In increases towards 1.0 two effects severely limit the possible wavelength region.

The first is that the strain, caused by the lattice mismatch between GaN and the said active layer, becomes increasingly large and to prevent the active layer being destroyed via dislocations the maximum thickness possible for the active layer reduces very severely so that in practice lasers can only use active layer in the range (0<x<0.3).

The second limiting factor is that there is a miscibility gap in the $In_xGa_{1-x}N$ system. That is to say that over the region (0.3<x<0.85) it is very difficult to produce good quality alloys thus the choice of active layer becomes limited.

Due to the rather limited range of $In_xGa_{1-x}N$ used in the active layers of these devices two problems arise.

The first is that the low values of x result in the band offsets between the active and optical guide layers being small, leading the problems of carrier overflow thus resulting in reduced efficiency of the devices. Thus even in the short wavelength devices currently being constructed there is a substantial overflow current.

The second problem is that the guide layers are limited, in practice, to GaN or to very low indium content $In_xGa_{1-x}N$ thus the refractive index difference between the $Al_xGa_{1-x}N$ cladding layers and the guide layers is somewhat fixed.

Although this could be remedied by changing the content of Al in the $Al_xGa_{1-x}N$ problems in growth temperature and lattice mismatch problems effectively limit the maximum x at about 0.2 and the minimum is limited, by the need to prevent carrier overflow from the active layer, to be around about 0.1.

Thus, this lack of control over the refractive index difference makes it difficult to produce high power devices as the refractive index difference at present is too high in that the emitted light is severely constricted to the active layer, making device failure due to catastrophic optical damage of the facets occur at very low output powers.

The problem with the present technology, that this invention overcomes, is that workers to date have been limited to working with active layers and optical guide layers within a very restricted range of alloy contents which means that carrier overflow, high optical confinement and restricted wavelength of laser emission could not be overcome.

We have discovered a method of introducing ZnO/$In_xGa_{1-x}N$ ($0.1 \leq x \leq 0.3$) and ZnO/GaN layers into the GaN based laser devices that allows the aforementioned problems to be overcome or at least significantly improved. This results in GaN devices having longer lifetimes and longer wavelengths than is possible with more traditional methods.

Figure 18:
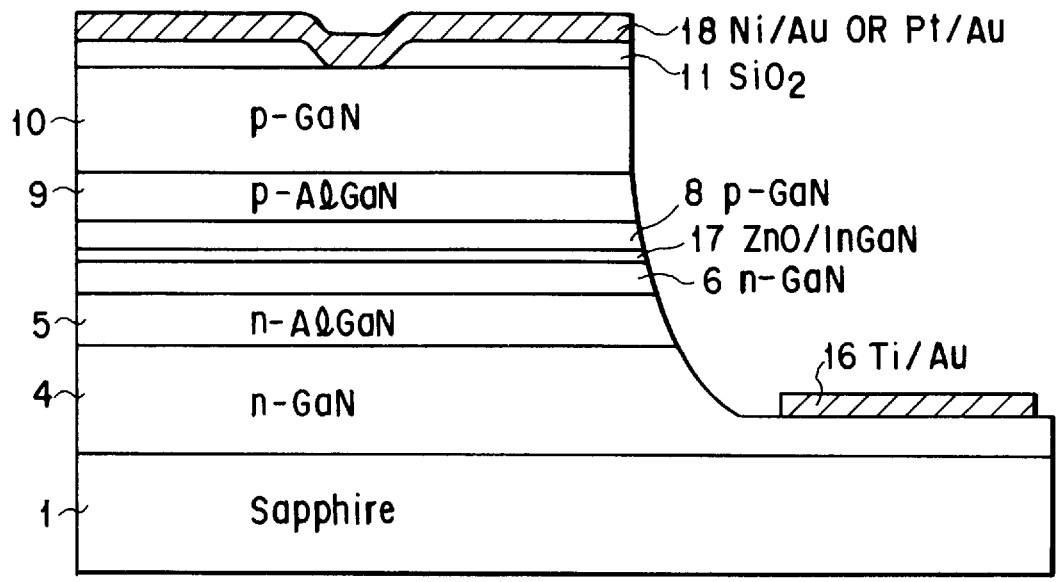
FIG. 18 is a cross-sectional view showing a typical GaN-based device with a ZnO/InGaN short period superlattice active layer.
Figure 19:
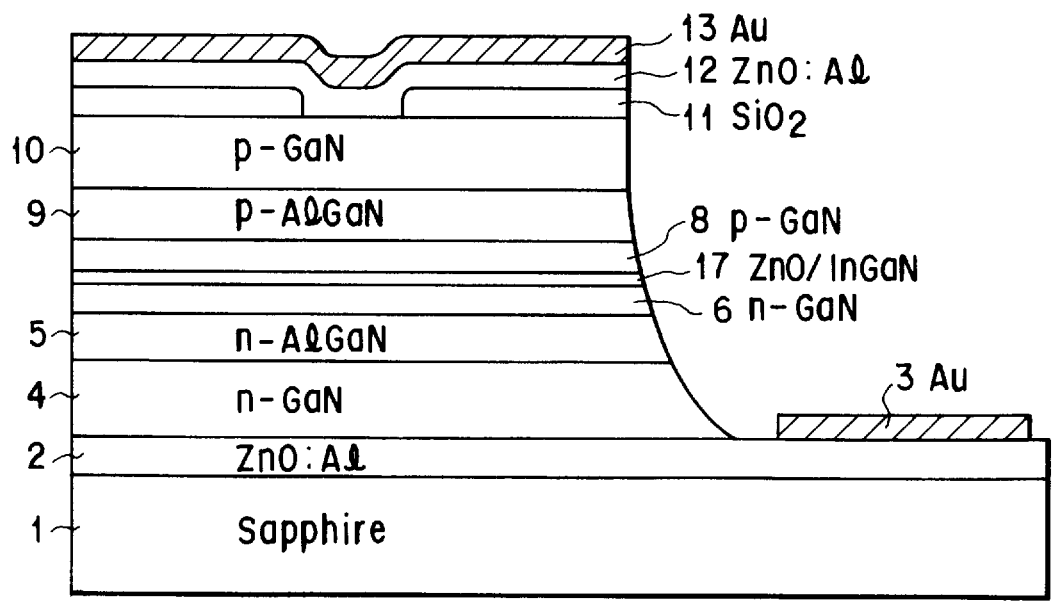
FIG. 19 is a cross-sectional view showing a typical GaN-based device, with Al-doped ZnO contact layers and a ZnO/InGaN short period super lattice active layer.

FIGS. 18, 20 and 22 illustrate the various applications of this patent both for a more conventional laser structure, and FIGS. 19, 21 and 23 for a laser structure with Al-doped contact regions. These, in order, are a laser with a ZnO/InGaN short period superlattice active layer, a laser with ZnO/GaN short period superlattice optical guide layers and a laser containing both aspects. These will now be discussed in more detail below.

Figure 24:
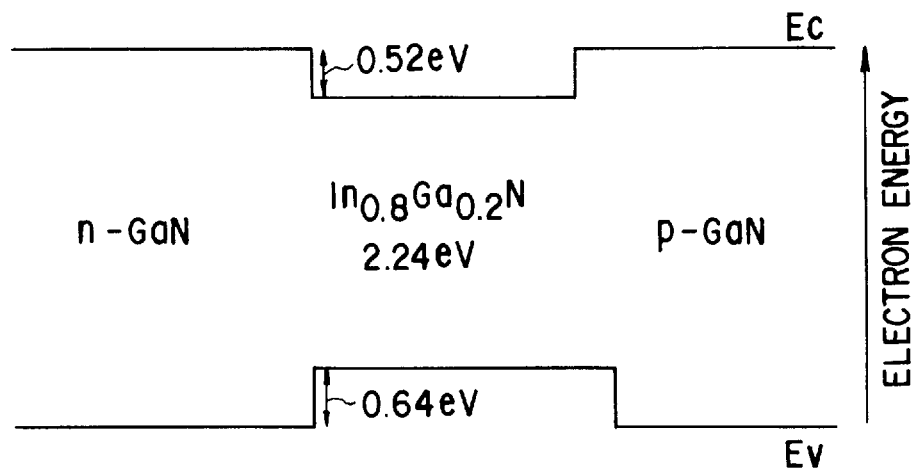
FIG. 24 is a band diagram of the active region area in a long wavelength GaN-based laser.

FIGS. 24 and 25 show the application of a long wavelength active layer to a GaN based laser diode. FIG. 24 is the conventional way that most people would try to use to obtain a long wavelength laser, in this case emitting orange yellow light.

As can be seen the In content is quite large at 0.8 and it is doubtful whether such an active layer could be constructed without problems of high dislocation density and high point defect concentrations. This, as discussed above, is due to the large lattice mismatch with GaN and also the high concentration of In means that the incorporation of oxygen as an impurity is enhanced due to indium's affinity for oxygen.

To overcome these problems a ZnO/InN short period superlattice active layer was used with ZnO at a thickness of 0.6 nm and InN at a thickness of 1.8 nm. With the band folding effect the ZnO and GaN band intermix resulting in an effective bandgap of 2.26 eV as shown in FIG. 25.

Since it is a superlattice the total thickness of InN is much less than that required for the bulk InGaN active layer and thus the problems concerning the lattice mismatch are thereby reduced.

Also, the optical efficiency of high indium content InGaN is low due to incorporated defects, while the band folding effect has been shown in the past to enhance the direct recombination efficiency substantially, for example in the case of GaP/AlP short period superlattices. Thus, using the short period superlattice also boosts the direct recombination efficiency of the device lowering the devices overall threshold current density.

Figure 26:
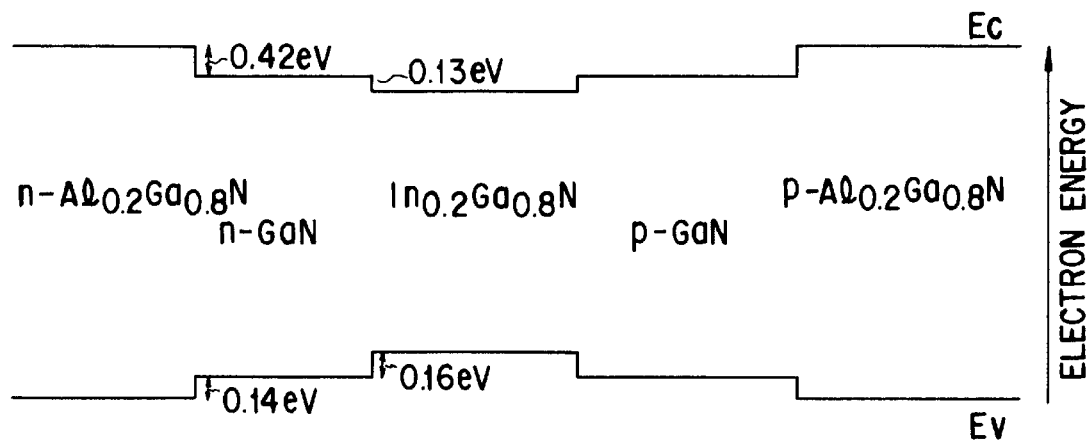
FIG. 26 is a band diagram of the active layer area in a short wavelength GaN-based laser.
Figure 27:
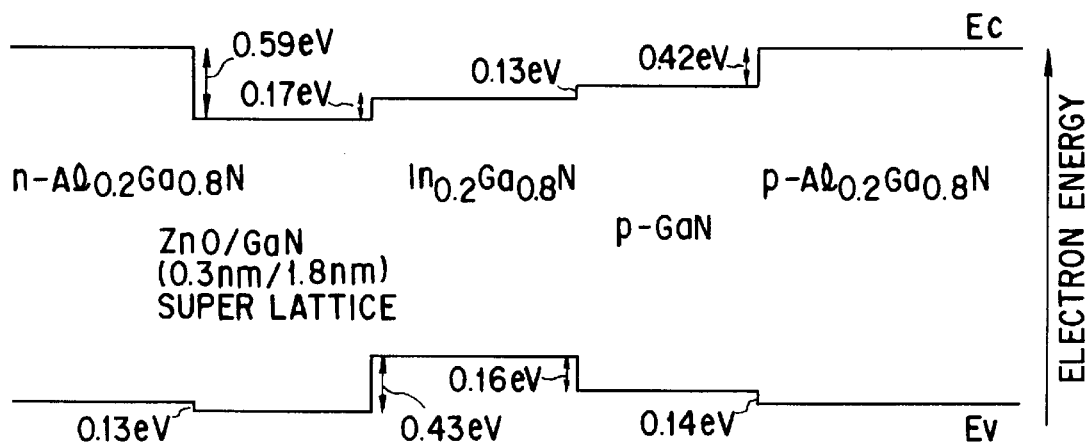
FIG. 27 is a band diagram of the active layer area in a short wavelength GaN-based laser with a ZnO/GaN short period superlattice optical guide layer.

FIGS. 26 and 27 show the effect of the use of a ZnO/GaN superlattice optical guide layer in a short wavelength laser. FIG. 26 is the standard method of preparing the laser with GaN optical guide layers. In FIG. 27 one of these layers is shown replaced by an ZnO/GaN short period superlattice optical guide layer where the relevant thicknesses are 0.3 nm and 1.8 nm respectively. Note that in this case the device was grown on a sapphire substrate with the c-face uppermost.

From the band diagram we can see that the holes, entering from the p-type AlGaN layer into the InGaN active layer face a higher barrier than before: 0.43 eV compared to 0.16 eV. This completely eliminates any hole overflow from the active layer towards the n-type AlGaN, cladding layer.

The use of this guide layer also lowers the refractive index difference between the cladding layers and the optical guide layers thus the emitted light is less severely restricted to the active layer and the optical power density at the facets is reduced, as the light is more spread out into the cladding layers, meaning that greater powers can be achieved before catastrophic optical damage occurs at the laser facets leading to device breakdown.

Figure 28:
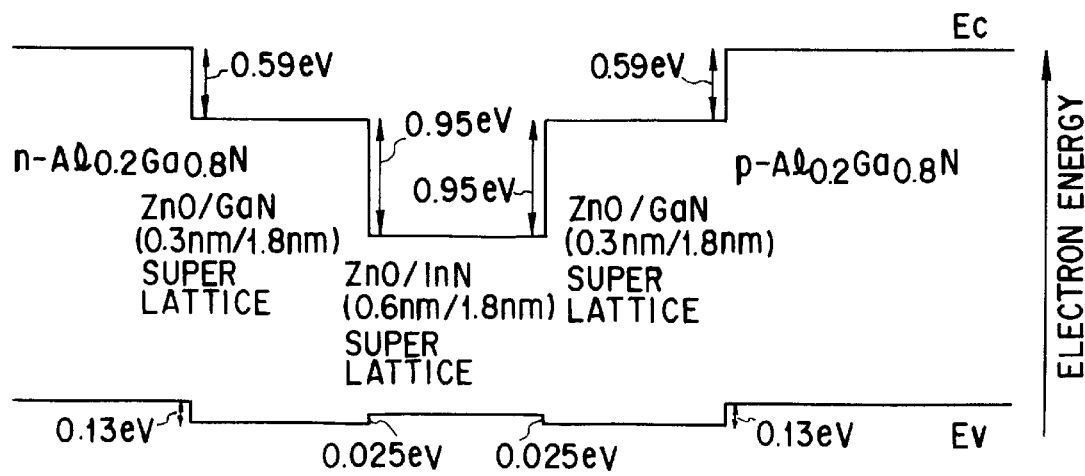
FIG. 28 is a band diagram of the active layer area in a long wavelength GaN-based laser with a ZnO/InN short period superlattice active layer and ZnO/GaN short period superlattice optical guide layers.

FIG. 28 is an example in which both ZnO/GaN short period superlattice optical guide layers and a short period superlattice ZnO/GaN active layer is employed in a long wavelength laser.

Hereinbelow, an eighth embodiment of the present invention, that is, a method of producing a semiconductor device having an Al-doped ZnO layer of the present invention.

The method of production of the Al-doped ZnO layers can be varied according to the constructed layers use. In the case of making a contact to the uppermost face of a device, say p-type, where the Al-doped ZnO is sandwiched between the p-GaN and the metallic, for example Au, contact.

In this case it makes little difference if the resultant layer is polycrystalline or single crystalline, and we need not take such great care over the production of the said layer. Straight forward evaporation, such as using electron beam evaporation techniques is good enough, if the evaporation is carried out by heating the substrate at 100°–300° C. and using ZnO and $Al_2O_3$ as the evaporation sources.

In the case of Al-doped ZnO onto which the subsequent device having a single crystalline multilayer structure is grown, more care is required to ensure a good crystalline quality of the subsequent device. In these cases more sophisticated growth techniques of ZnO, such as molecular beam epitaxy (MBE), metal organic chemical vapor deposition (MOCVD), and liquid phase epitaxy (LPE), are best used as the resultant single crystalline material is greatly improved.

If the MBE method is used, epitaxial growth is made at a substrate temperature of 600°–800° C. by use of beam sources consisting of solid sources Zn and Al with an $O_2$ plasma. When the MOCVD method is used, the epitaxial growth is performed at room temperature by use of di-methyl-zinc (DMZ) or di-ethyl-zinc as the Zn source, pure $O_2$ as the oxygen source, and tri-methyl-aluminum (TMA) or di-methyl-aluminum hydride (DMAH) as the Al source for doping.

In the case of a GaN based device to be grown onto the ZnO:Al layer, due to the strength of the wurtzite structure, a simpler method can be used such as sputtering technique in conjunction with heat treatments. When the sputter method is used, an Al-doped ZnO pellet is used as the sputtering source.

However, the resultant devices are not as high quality as the device having MBE, MOCVD, CVD, and LPE grown Al-doped ZnO buffer regions.

Additional advantages and modifications will readily occur to those skilled in the art. Therefore, the invention in its broader aspects is not limited to the specific details, and representative embodiments shown and described herein.

For example, the material for ohmic contact is not limited to Al-doped ZnO. Use may be made of conductive oxide such as $In_xZn_{1-x}O$, Al-doped $In_xZn_{1-x}O$, $Sn_xZn_{1-x}O$, Al-doped $Sn_xZn_{1-x}O$, $In_xSn_yZn_{1-x-y}O$, and Al-doped $In_xSn_yZn_{1-x-y}O$ ($0 \leq x \leq 1$, and $0 \leq x+y \leq 1$). As the underlying layer of conductive oxide, use may be made of GaN and $In_xGa_{1-x}N$ ($0 \leq x \leq 0.2$).

In the first to third embodiments, the cases are explained in which GaN, $In_xGa_{1-x}N$ and $Ga_xAl_{1-x}N$ ($0 \leq x \leq 1$) are employed as a compound semiconductor material. The same advantages as offered in these embodiments can be obtained in the case of using InN, AlN, $In_xAl_{1-x}N$ or $In_xGa_yAl_{1-x-y}N$ ($0 \leq x \leq 1$, $0 \leq x+y \leq 1$).

In the fifth and sixth embodiment, semiconductor materials such as ZnSe, ZnS, $Zn_xS_{1-x}Se$, $Mg_xZn_{1-x}Se$, $Cd_xZn_{1-x}Se$, $Mg_xZn_yS_{1-x-y}Se$ ($0 \leq x \leq 1$, and $0 \leq x+y \leq 1$) may be used.

Accordingly, various modifications may be made without departing from the spirit or scope of the general inventive concept as defined by the appended claims and their equivalents.

We claim:

1. A semiconductor device comprising:
   a substrate on which compound semiconductor layers in the form of a multilayered structure are formed;
   at least one compound semiconductor contact layer;
   a first metal electrode and a second metal electrode for supplying current to said compound semiconductor layers; and
   a metal oxide layer;
   wherein said metal oxide layer is formed between at least one pair selected from the group consisting of
      said substrate and said compound semiconductor contact layer,
      said compound semiconductor contact layer and said first metal electrode, and
      said second metal electrode and said substrate; and
   wherein said metal oxide layer has a metallic impurity band under the conduction band and is formed in contact through upper and lower surfaces thereof with said at least one pair.

2. The semiconductor device according to claim 1, wherein said metal oxide layer is one selected from an Al-doped ZnO layer, an $In_xZn_{1-x}O$ layer, an Al-doped $In_xZn_{1-x}O$ layer, a $Sn_xZn_{1-x}O$ layer, an Al-doped $Sn_xZn_{1-x}O$ layer, an $In_xSn_yZn_{1-x-y}O$ layer, and an Al-doped $In_xSn_yZn_{1-x-y}O$ layer ($1 \geq x \geq 0$ and $1 \geq x+y \geq 0$ where the doping amount of Al is several percent).

3. The semiconductor device according to claim 1, wherein said compound semiconductor contact layer is made of at least one selected from the group consisting of GaN, AlN, $In_xGa_{1-x}N$, $In_xAl_{1-x}N$, $Ga_xAl_{1-x}N$, and $In_xGa_yAl_{1-x-y}N$ ($0 \leq x \leq 1$ and $0 \leq x+y \leq 1$).

4. The semiconductor device according to claim 1, wherein said compound semiconductor contact layer is made of at least one selected from the group consisting of ZnSe, ZnS, $Zn_xS_{1-x}Se$, $Mg_xZn_{1-x}Se$, $Cd_xZn_{1-x}Se$ and $Mg_xZn_yS_{1-x-y}Se$ ($0 \leq x \leq 1$ and $0 \leq x+y \leq 1$).

5. The semiconductor device according to claim 1, wherein said substrate is made of sapphire.

6. The semiconductor device according to claim 1, wherein said substrate is made of SiC.

7. A semiconductor device comprising:
   an insulating single crystalline growth substrate;
   a light emitting active layer;
   at least one optical guide layer;
   at least one cladding layer;
   at least one compound semiconductor contact layer;
   a first metal electrode and a second metal electrode for current supply; and
   a metal oxide layer;
   wherein said metal oxide layer is formed between at least one pair selected from the group consisting of
      said single crystalline substrate and said compound semiconductor contact layer;
      said compound semiconductor contact layer and said first metal electrode; and
      said single crystalline substrate and said second metal electrode; and
   wherein said metal oxide layer has a metallic impurity band under the conduction band and is formed in contact through upper and lower surfaces thereof with said at least one pair.

8. The semiconductor device according to claim 7, wherein said metal oxide layer is one selected from an Al-doped ZnO layer, an $In_xZn_{1-x}O$ layer, an Al-doped $In_xZn_{1-x}O$ layer, a $Sn_xZn_{1-x}O$ layer, an Al-doped $Sn_xZn_{1-x}O$ layer, an $In_xSn_yZn_{1-x-y}O$ layer, and an Al-doped $In_xSn_yZn_{1-x-y}O$ layer ($1 \geq x \geq 0$ and $1 \geq x+y \geq 0$ where the doping amount of Al is several percent).

9. The semiconductor device according to claim 7, wherein said compound semiconductor contact layer is either GaN or $In_xGa_{1-x}N$ ($0 \leq x \leq 0.2$).

10. The semiconductor device according to claim 7, wherein said compound semiconductor contact layer is either ZnSe or $Zns_xSe_{1-x}$ ($0.7 \leq x \leq 1$).

11. A semiconductor device comprising:
    a conductive single crystalline growth substrate;
    a light emitting active layer;
    at least one optical guide layer;
    at least one cladding layer;
    at least one compound semiconductor contact layer;
    a first metal electrode and a second metal electrode for current supply; and
    a metal oxide layer;
    wherein said metal oxide layer is formed between at least one pair selected from the group consisting of
       said single crystalline substrate and said compound semiconductor contact layer; and
       said compound semiconductor contact layer and said first metal electrode,
    wherein said metal oxide layer has a metallic impurity band under the conduction band and is formed in contact through upper and lower surfaces thereof with said at least one pair.

12. The semiconductor device according to claim 11, wherein said metal oxide layer is one selected from an Al-doped ZnO layer, an $In_xZn_{1-x}O$ layer, an Al-doped $In_xZn_{1-x}O$ layer, a $Sn_xZn_{1-x}O$ layer, an Al-doped $Sn_xZn_{1-x}O$ layer, an $In_xSn_yZn_{1-x-y}O$ layer, and an Al-doped $In_xSn_yZn_{1-x-y}O$ layer ($1 \geq x \geq 0$ and $1 \geq x+y \geq 0$ where the doping amount of Al is several percent).

13. The semiconductor device according to claim 11, wherein said compound semiconductor contact layer is either GaN or $In_xGa_{1-x}N$ ($0 \leq x \leq 0.2$).

14. The semiconductor device according to claim 11, wherein said compound semiconductor contact layer is either ZnSe or $ZnS_xSe_{1-x}$ ($0.7 \leq x \leq 1$).

15. A semiconductor device comprising:
    a single crystalline growth substrate;
    a light emitting active layer;

at least one optical guide layer;

at least one cladding layer;

at least one compound semiconductor contact layer; and a first metal electrode and a second metal electrode for current supply, wherein said light emitting active layer is made of $In_xGa_{1-x}N$ ($0.1 \leq x \leq 0.3$) and said at least one optical guide layer is made of a superlattice consisting of a plurality of Al-doped ZnO thin layers and a plurality of GaN thin layers superimposed alternately on top of the other.

16. A semiconductor device comprising:

a single crystalline growth substrate;

a light emitting active layer;

at least one optical guide layer;

at least one cladding layer;

at least one compound semiconductor contact layer; and a first metal electrode and a second metal electrode for current supply, wherein said light emitting active layer is made of a superlattice consisting of a plurality of ZnO thin layers and a plurality of $In_xGa_{1-x}N$ ($0 \leq x \leq 0.3$) thin layers superimposed alternately on top of the other; and said at least one optical guide layer is made of GaN.

17. A semiconductor device comprising:

a single crystalline growth substrate;

a light emitting active layer;

at least one optical guide layer;

at least one cladding layer;

at least one compound semiconductor contact layer; and a first metal electrode and a second metal electrode for current supply, wherein said at least one optical guide layer is formed of a short period superlattice consisting of a plurality of ZnO thin layers and a plurality of GaN thin layers superposed alternately one on top of the other.

18. A semiconductor device comprising:

a single crystalline growth substrate;

a light emitting active layer;

at least one optical guide layer;

at least one cladding layer;

at least one compound semiconductor contact layer; and a first metal electrode and a second metal electrode for current supply, wherein said light emitting active layer is formed of a short period superlattice consisting of a plurality of ZnO thin layers and a plurality of thin layers represented by $In_xGa_{1-x}N$ (either $0.1 \leq x \leq 0.3$ or $X=1$) superposed alternately one on top of the other.

19. A semiconductor device comprising:

an insulating single crystalline growth substrate;

a light emitting active layer;

at least one optical guide layer;

at least one cladding layer;

at least one compound semiconductor contact layer;

a first metal electrode and a second metal electrode for current supply; and a metal oxide layer;

wherein said metal oxide layer is formed on said insulating single crystalline growth substrate, and said compound semiconductor contact layer is formed in contact with said metal oxide layer upon which the device's cladding, guide, and light emitting active layers are formed, and said second metal electrode is formed in contact with said metal oxide layer on the formation region of said second metal electrode, and said current supply is performed laterally through said metal oxide layer.

20. The semiconductor device according to claim 19, wherein said metal oxide layer is one selected from an Al-doped ZnO layer, an $In_xZn_{1-x}O$ layer, an Al-doped $In_xZn_{1-x}O$ layer, a $Sn_xZn_{1-x}O$ layer, an Al-doped $Sn_xZn_{1-x}O$ layer, an $In_xSn_yZn_{1-x-y}O$ layer, and an Al-doped $In_xSn_yZn_{1-x-y}O$ layer ($1 \geq x \geq 0$ and $1 \geq x+y \geq 0$ where the doping amount of Al is several percent).

21. The semiconductor device according to claim 19, wherein said metal oxide layer has a metallic impurity band under the conduction band.

* * * * *